(12) United States Patent
Lee

(10) Patent No.: US 6,768,340 B2
(45) Date of Patent: Jul. 27, 2004

(54) FAULT-TOLERANT INVERTER CIRCUIT

(75) Inventor: Chin Lee, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/308,031

(22) Filed: Dec. 3, 2002

(65) Prior Publication Data

US 2004/0000930 A1 Jan. 1, 2004

(30) Foreign Application Priority Data

Jun. 28, 2002 (TW) .......................... 91114462 A

(51) Int. Cl.[7] .................................. H03K 19/0175
(52) U.S. Cl. ..................... 326/83; 326/46; 326/112; 326/119; 326/121; 326/122; 327/108; 327/215
(58) Field of Search ................... 326/46, 83, 112, 326/119, 121, 122, 129; 327/108, 215

(56) References Cited

U.S. PATENT DOCUMENTS 5,467,038 A * 11/1995 Motley et al. .............. 327/185
6,211,713 B1 * 4/2001 Uhlmann .................... 327/211
6,621,318 B1 * 9/2003 Burr .......................... 327/218

FOREIGN PATENT DOCUMENTS

CH             1391349 A  *  7/2002

* cited by examiner

Primary Examiner—Michael Tokar
Assistant Examiner—Khai Nguyen
(74) Attorney, Agent, or Firm—Rosenberg, Klein & Lee

(57) ABSTRACT

The present invention provides a fault-tolerant inverter circuit, comprising a signal input point for receiving the input signals. A first inverter, the input end of the first inverter connects to the signal input point. A second inverter, the input end of the second inverter connects to the output end of the first inverter. A third inverter, the input end of the third inverter connects to the output end of the second inverter. A signal output point, and it is used to connect the output end of the third inverter. A first conducting wire, the two ends of which connect respectively to the signal input point of the first inverter and the output end of the second inverter. A second conducting wire, the two ends of which connect respectively to the outputting end of the first inverter and the signal output point. Therefore, the fault-tolerant inverter of the present invention provides fault-tolerance when an opening occurs in any conducting wire or transistor.

15 Claims, 5 Drawing Sheets

FAULT-TOLERANT INVERTER CIRCUIT

BACKGROUND OF THE INVENTION

1. Field of the Invention

The present invention relates to circuit design and, more particularly to a method for designing an inverter circuit that offers fault-tolerance.

2. Description of the Prior Art

As far as a common circuit design is concerned, the inverter circuit design is not only widely applied in circuit designing, but is also an indispensable basic circuit design that is widely used. The FIG. 1a and FIG. 1b respectively show the block diagram and circuit diagram of an inverter. When the inverter is applied in a digital-logic circuit design, it is used to invert the signal, as the input point A and the output point B are shown in FIG. 1b. With the input signal of point A being "1", point B outputs an inverted signal "0". In contrast, when the input signal of point A being "0", point B output is an inverted signal "1".

The FIG. 1c which shows the inverter circuit layout diagram in semi-conductor fabrication, and FIG. 1d is the cross-sectional view from the line L–L' of the FIG. 1c. With the advancement of the semi-conductor fabrication and requirement of the density on a chip, thus the capacity of the transistors on an integrated circuit are increased, however, this means that the density of the circuit layout on an integrated circuit also raises. The input point 100 connects to the first signal wiring 104 through the first contact via 102. The second signal wiring 106 on the same layer is used to connect the source/drain implanting area 112A of the P-type transistor 112 and the source/drain implanting area 114A of the N-type transistor 114, and conducting the signal to the output point 110 through the second contact plug 108. It can be seen from the FIG. 1c and FIG. 1d that in the conventional inverter circuit layout, the first signal wiring 104 and the second signal wiring 106 are on the same metal layer, and the space S1 between the first signal wiring 104 and the second signal wiring 106 is the nearest place among these wires, therefore, where is the place to a short circuit occurring during producing, and once if there is a short or open among the circuit, the function of whole circuit will become abnormal.

Accordingly, during the fabrication in a foundry, if there's a problem with any wires or transistors of an inverter on a chip, the inverter cannot operate normally, and this affects the function of the whole chip. The influences by such defects are from the test yield before shipping to the reliability and the stability of whole system after the chip is used inside. That is to say, during the fabrication in a foundry, it's easy to create flaws in the conventional circuit design, signal errors during testing, and even serious mistakes in the whole chip or system.

SUMMARY OF THE INVENTION

Concerning the defects that occur from the conventional inverter circuit design method in the background of the invention. In order to solve the disadvantages of the conventional inverter circuit, the present invention provides a method for designing fault-tolerant inverter circuit.

The object of the present invention is to provide a fault-tolerant inverter circuit.

Another object of the present invention is to improve the testing yield of the chip that contains the fault-tolerant inverter circuit of the present invention.

And still yet another object of the invention is to improve the reliability of a system that contains the fault-tolerant inverter circuit of the present invention.

According to the foregoing objects, the present invention provides a fault-tolerant inverter circuit, comprising: a signal inputting point and it is used to receive an inputting signal. A first inverter with an inputting end and an outputting end, and it is used to invert a signal from its inputting end to its outputting end, the inputting end of said first inverter connects to said signal inputting point. A second inverter with an inputting end and an outputting end is also used to invert a signal from its inputting end to its outputting end. The inputting end of said second inverter connects to the outputting end of said first inverter. A third inverter with an inputting end and an outputting end is used to invert a signal from its inputting end to its outputting end. The inputting end of said third inverter connects to the outputting end of said second inverter. A signal outputting pointconnects to the outputting end of said third inverter. A first conducting wire, the two ends of said first conducting wire connect to the said signal inputting point and the inputting end of said third inverter respectively. A second conducting wire, the two ends of the said second conducting wire connects to the outputting end of the said first inverter and said signal outputting point.

Accordingly, the fault-tolerant inverter of the present invention provides a fault-tolerance capability when any conducting wiring or any transistor is open, and even holds 50% of the fault-tolerance when any one transistor shorts. The invention also discloses that increasing the space in a specific location on the semiconductor-wiring layout to avoid a short from occurring.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

The FIG. 1a is a block diagram of a conventional inverter.

Figure 1A:
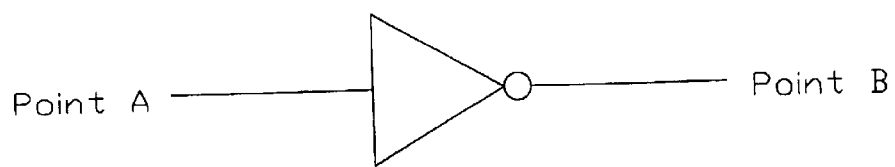
Figure 1B:
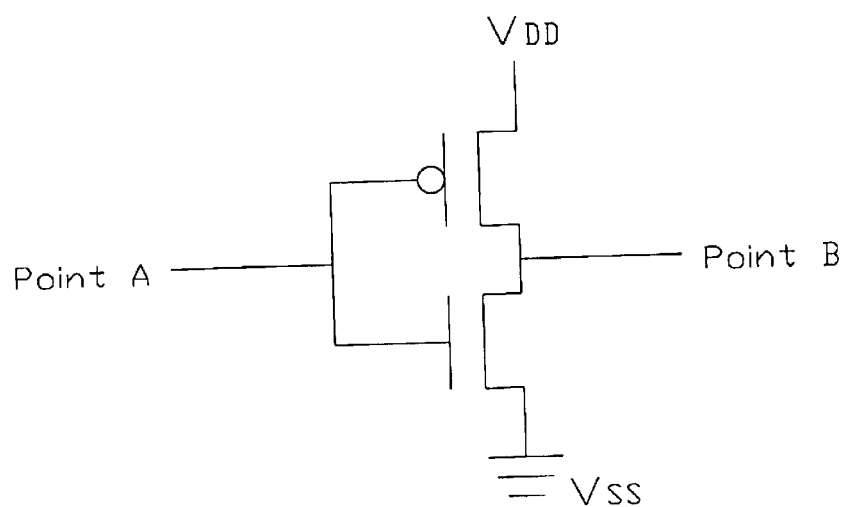

The FIG. 1b is a circuit diagram of a conventional inverter.

Figure 1C:
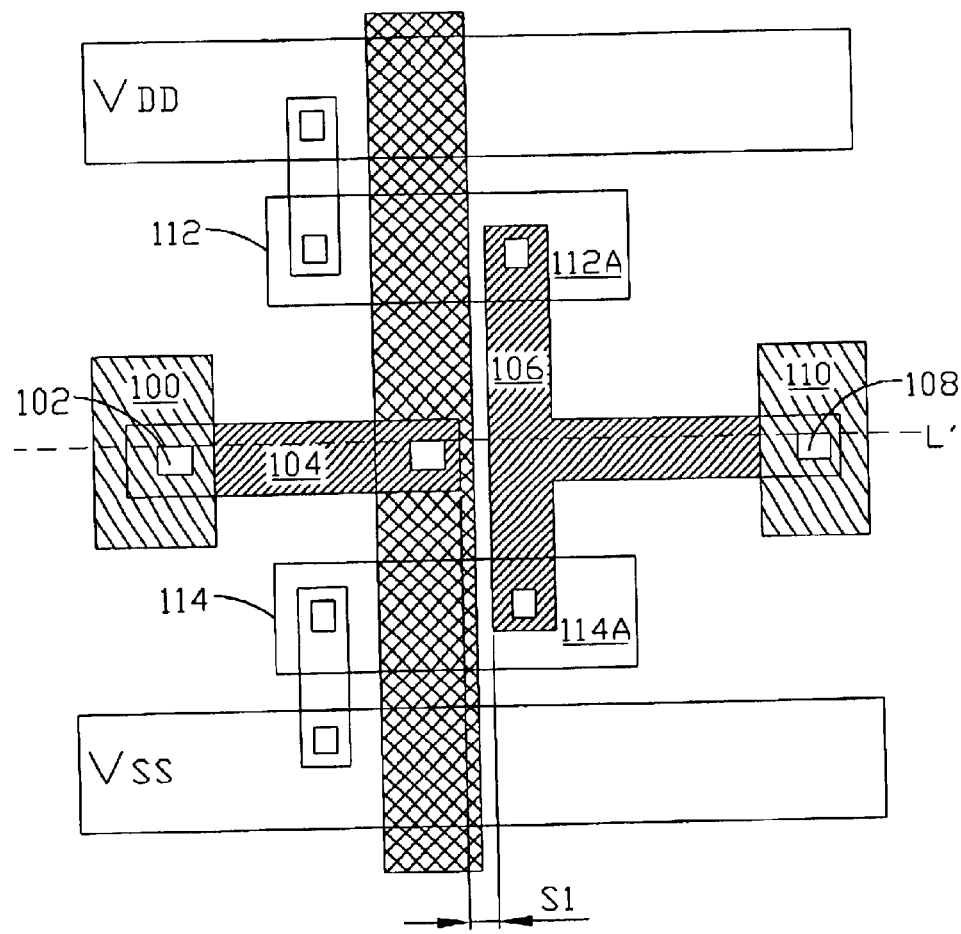

The FIG. 1c is a circuit layout of a conventional inverter in semiconductor fabrication.

Figure 1D:
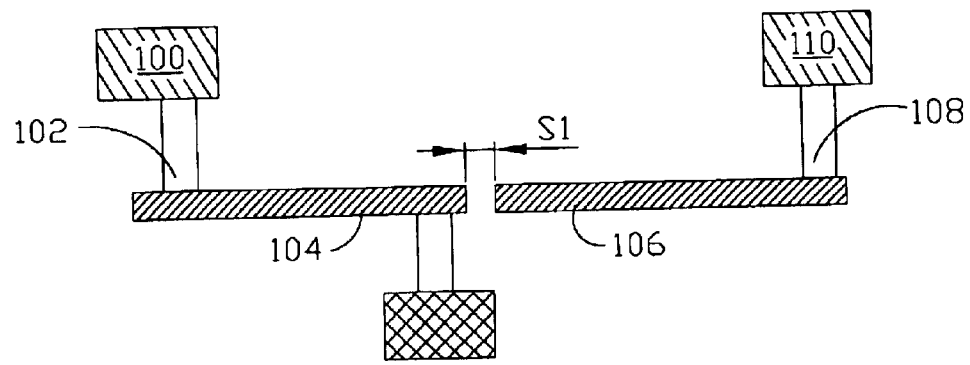

The FIG. 1d is a sectional view of the FIG. 1c from line L–L'.

Figure 2:
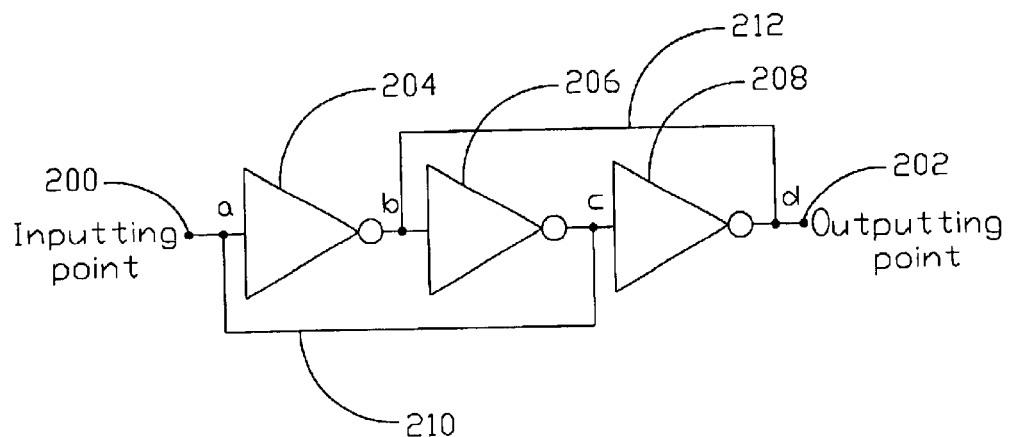

The FIG. 2 is the block diagram of the fault-tolerant inverter of the present invention.

Figure 3:
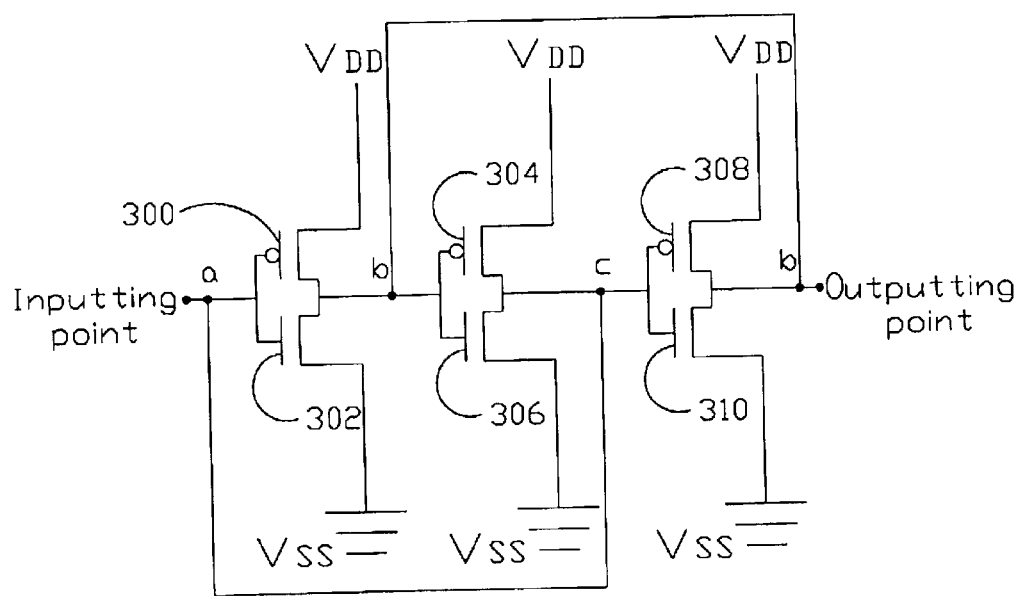

The FIG. 3 is the circuit diagram of the fault-tolerant inverter of the present invention.

Figure 4A:
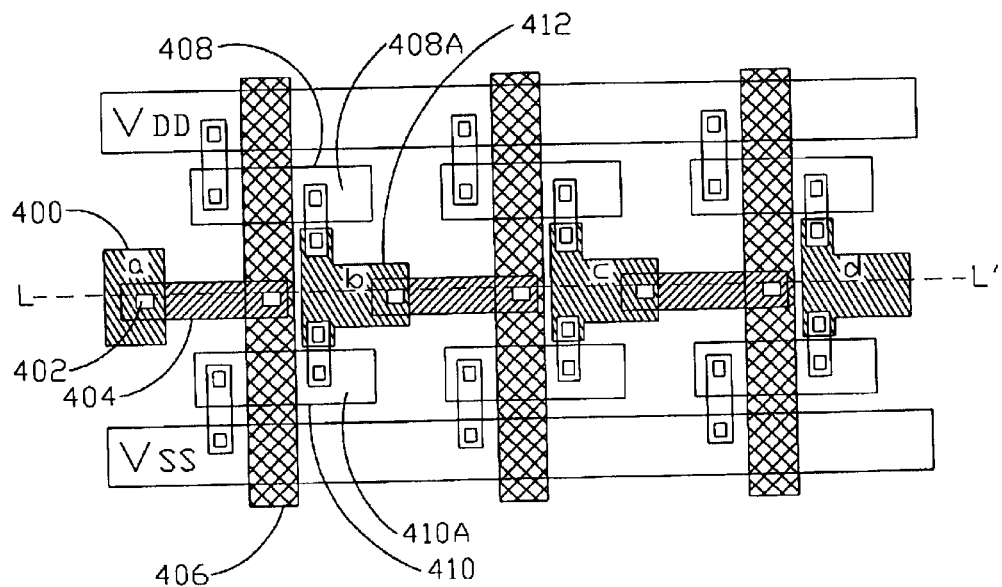

The FIG. 4a is the circuit layout of the fault-tolerant inverter of the present invention.

Figure 4B:
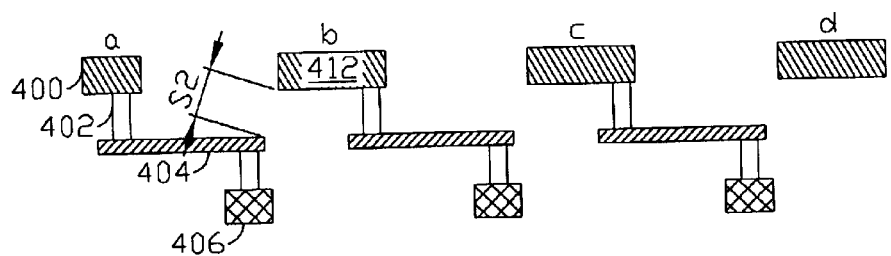

The FIG. 4b is the sectional view of the FIG. 4a from the line L–L'.

Figure 5:
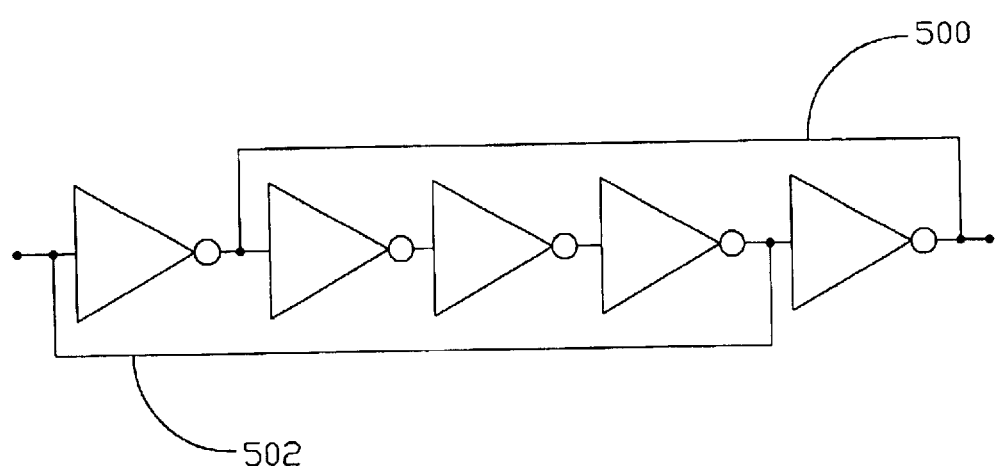

The FIG. 5 is another preferred embodiment of the present invention.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

FIG. 2 is a preferred embodiment of the present invention, shown is a design block diagram of a fault-tolerant inverter. Wherein a input point 200 receives a signal, and a output point 202 outputs an inverted signal, and the fault-tolerant inverter design block diagram is formed according to three connected inverters. The input point 200 connects to the input end of the first inverter 204, and the output end of the first inverter 204 connects to the input end of the second inverter 206. The output end of the second inverter 206 connects to the input end of the third inverter 208 and the output point 202 connects to the output end of the third inverter 208. Furthermore, a first conducting wire 210 is used to link the input point 200 to the input end of the third inverter 208. A second conducting wire 212 is used to link the output end of the first inverter 204 to the output point 202.

Therefore, when the foregoing fault-tolerant inverter performs a normal logic operation e.g. a=1, the logic signals at other nodes are b=0, c=1, and d=0. Contrariwise, if a=0, the logic signals turn to b=1, c=0, and d=1, the end "a" is the input end and the end "d" is the output end. Thus, the fault-tolerant inverter operates as a conventional inverter under normal conditions. Nevertheless, the fault-tolerant inverter of the present invention allows any one conducting wire or transistor to open in fabrication, but without the effects of getting the correct signal. Therefore, passing the correct signal over the damaged inverter to the next inverter by a conducting wire to reach the purpose of fault-tolerance and improve the reliability of the present invention.

FIG. 3 is shown with an equivalent circuit diagram of FIG. 2. The purpose of the first P-type transistor 300 and the first N-type transistor 302 is equivalent to the first inverter 204 that's shown in FIG. 2. The gate of the first P-type transistor 300 and the gate of the first N-type transistor 302 connects to the signal input point. The drain of the first P-type transistor 300 and the drain of the first N-type transistor 302 are coupled to form an output end of the first inverter 204. The second P-type transistor 304 and the second N-type transistor 306 are constructed and then the second inverter 206, the gate of the second P-type transistor 304 and the gate of the second N-type transistor 306 are connected to the output end of the first inverter 204. The drain of the second P-type transistor 304 and the drain of the second N-type transistor 306 are coupled to form an output end of the second inverter 206. The third P-type transistor 308 and the third N-type transistor 310 are constructed and then the third inverter 208, the gate of the third P-type transistor 308 and the gate of the third N-type transistor 310 are connected to the output end of the second inverter 206. The drain of the third P-type transistor 308 and the drain of the N-type transistor 310 are coupled to form an output end of the third inverter 208. As shown in FIG. 3. When an open occurs in any conducting wire or transistor, the operation logic results of each node are shown as follows:

The first N-type transistor 302 is open:
If a=1 b=error c=1 d=0 PASS
If a=0 b=1 c=0 d=1 PASS
The second N-type transistor 306 is open:
If a=1 b=0 c=error d=0 PASS
If a=0 b=1 c=0 d=1 PASS
The third N-type transistor 310 is open:
If a=1 b=0 c=1 d=0 PASS
If a=0 b=1 c=0 d=1 PASS
The first P-type transistor 300 is open:
If a=1 b=0 c=1 d=0 PASS
If a=0 b=error c=0 d=1 PASS
The second P-type transistor 304 is open:
If a=1 b=0 c=error d=0 PASS
If a=0 b=1 c=0 d=1 PASS
The third P-type transistor 306 is open:
If a=1 b=0 c=1 d=0 PASS
If a=0 b=1 c=0 d=1 PASS
When the upper conducting wire or the lower conducting wire is open:
If a=1 b=0 c=1 d=0 PASS
If a=0 b=1 c=0 d=1 PASS Accordingly, it can be seen that from the situations listed above that any conducting wire or transistor is open, the fault-tolerant inverter of the present invention can hold the output result at 100% correct. However, if there's a short in any transistors in FIG. 3, the operation logic results of each node are shown as follows:

The first N-type transistor 302 is short:
If a=1 b=0 c=1 d=0 PASS
If a=0 d=error FAIL
The second N-type transistor 306 is short:
If a=1 d=error FAIL
If a=0 b=1 c=0 d=1 PASS
The third N-type transistor 310 is short:
If a=1 b=0 c=1 d=0 PASS
If a=0 d=error FAIL
The first P-type transistor 300 is short:
If a=1 d=error FAIL
If a=0 b=1 c=0 d=1 PASS
The second P-type transistor 304 is short:
If a=1 b=0 c=1 d=0 PASS
If a=0 d=error FAIL
The third P-type transistor 306 is short:
If a=1 d=error FAIL
If a=0 b=1 c=0 d=1 PASS According to the above results, when a short occurs in any transistor, the fault-tolerant inverter of the invention still covers 50% of the fault. However, the shorts in a transistor are usually caused by the high integrity of the circuit layout in fabrication, as described in the foregoing background of the invention.

FIG. 4a is a preferred integrated layout diagram of the fault-tolerant inverter shown in FIG. 3. FIG. 4b is a portion of the sectional view from line L–L' in FIG. 4a, wherein the contact point 400 connects to the gate signal leading wiring 404 through the first contact plug 402, and the gate signal leading wiring 404 is linked to the gate wiring 406. The source/drain implanting area 408A of the P-type transistor region 408 and the source/drain implanting area 410A of the N-type transistor region 410 are linked to the source/drain signal wiring 412 by contact plugs respectively. This results in the source/drain signal wiring 412, gate signal leading wiring 404 ending up on different layers. Therefore, due to the space S2 between the gate signal leading wiring 404 and the source/drain signal wiring 412 becomes wider. The possibility of a short can be prevented, and as a result, the fault-tolerant inverter of the present invention effectively avoids the fault that is caused by a short, which cannot be covered by the fault-tolerance inverter.

FIG. 5 is another preferred embodiment of the present invention, a plurality of series connection inverters form a fault-tolerant inverter. These inverters have a route to bypass, even the inverters of a series connection. As shown in FIG. 5, the first conducting wire 500 bypass a set of four inverters and a series of connections then connect to the output end. The second conducting wire 502 bypass' four inverter sets, then connects to the input end of the inverter 512. This preferred embodiment could also hold the correct output when a short occurs in any conducting wire or transistor.

The probability of problems occurring in two transistors or two conducting wires at the same time is extremely low, therefore, the fault-tolerant inverter of the present invention provides 100% capability in fault-tolerance. However when an opening occurs in any conducting wire or transistor, a 50% capability of fault-tolerance is held when any transistor occurs a short. The present invention also discloses that increasing the space among specific places of the integrated circuit layout to further avoid shorts from occurring, and allows the fault-tolerant inverter of the present invention provide it's excellent fault-tolerance to prevent a short from occurring.

Although specific embodiments have been illustrated and described, it will be obvious to those skilled in the art that various modifications may be made without departing from what is intended to be limited solely by the appended claims.

What is claimed is:

1. A fault-tolerant inverter, comprising:
    a first inverter, said first inverter has an inputting end and an outputting end, said inputting end is used to receive an input signal, and then output an inverted signal from said outputting end, wherein the inputting end of said first inverter connects to a signal inputting point;
    a second inverter, said second inverter has an inputting end and an outputting end, said inputting end is used to receive an input signal, and then output an inverted signal from said outputting end, wherein the inputting end of said second inverter connects to the outputting end of said first inverter; and
    a third inverter, said third inverter has an inputting end and an outputting end, said inputting end is used to receive an input signal, and then output an inverted signal from said outputting end, wherein the inputting end of said third inverter connects to the outputting end of said second inverter,
    herein, the inputting end of said first inverter is further connected to the inputting end of said third inverter, and the outputting end of said first inverter is further connected to the outputting end of said third inverter for outputting an inverted signal of said input signal received from said signal inputting point.

2. The fault-tolerant inverter according to claim 1, wherein a gate signal leading wiring used to lead out the gate signal, and a source/drain signal wiring used to lead out a drain signal of said first inverter, said second inverter, and said third inverter are located on different circuit layers.

3. A fault-tolerant inverter circuit, comprising:
    a first P-type transistor and a first N-type transistor are constructed a first inverter, wherein the gate of said first P-type transistor and the gate of said first N-type transistor are coupled to form an inputting end of said first inverter for receiving an input signal, and the drain of said first P-type transistor and the drain of said first N-type transistor are coupled to form an outputting end of said first inverter;
    a second P-type transistor and a second N-type transistor are constructed a second inverter, wherein the gate of said second P-type transistor and the gate of said second N-type transistor are coupled to form an inputting end of said second inverter and connect to the outputting end of said first inverter, and the drain of said second P-type transistor and the drain of said second N-type transistor are coupled to form an outputting end of said second inverter; and
    a third P-type transistor and a third N-type transistor are constructed a third inverter, wherein the gate of said third P-type transistor and the gate of said third N-type transistor are coupled to form an inputting end of said third inverter and connect to the outputting end of said second inverter, and the drain of said third P-type transistor and the drain of said third N-type transistor are coupled to form an outputting end of said third inverter for outputting a output signal,
    herein, the inputting end of said first inverter is linked to the inputting end of said third inverter, and the outputting end of said first inverter is linked to the outputting end of said third inverter for outputting an inverted signal of said input signal received from said inputting end of said first inverter.

4. The fault-tolerant inverter according to claim 3, wherein a gate signal leading wiring for connecting the gate of said first P-type transistor and the gate of said first N-type transistor, a source/drain signal wiring for connecting the drain of said first P-type transistor and the drain of said first N-type transistor, said gate signal leading wiring and said source/drain signal wiring are located on different layers.

5. The fault-tolerant inverter according to claim 3, wherein a gate signal leading wiring for connecting the gate of said second P-type transistor and the gate of said second N-type transistor, a source/drain signal wiring for connecting the drain of said second P-type transistor and the drain of said second N-type transistor, said gate signal leading wiring and said source/drain signal wiring are located on different layers.

6. The fault-tolerant inverter according to claim 3, wherein a gate signal leading wiring for connecting the gate of said third P-type transistor and the gate of said third N-type transistor, a source/drain signal wiring for connecting the drain of said third P-type transistor and the drain of said third N-type transistor, said gate signal leading wiring and said source/drain signal wiring are located on different layers.

7. The fault-tolerant inverter according to claim 3, wherein the source of said first P-type transistor, said second P-type transistor, and said third P-type transistor are respectively linked to a high-level electric source.

8. The fault-tolerant inverter according to claim 3, wherein the source of said first N-type transistor, said second N-type transistor, and said third N-type transistor are respectively linked to a low-level electric source.

9. The fault-tolerant inverter according to claim 3, wherein the source of said first N-type transistor, said second N-type transistor, and said third N-type transistor are grounded respectively.

10. A fault-tolerant inverter circuit, comprising:
    a first inverter element, the inputting end of said first inverter element is received an input signal, wherein a gate signal leading wiring is used to lead out a gate signal from a gate wiring, and a source/drain signal wiring is used to lead out a drain signal, said gate signal leading wiring and said source/drain signal wiring of said first inverter element are located on different circuit layers;
    a second inverter element, the inputting end of said second inverter element is connected to the outputting end of said first inverter element, wherein a gate signal leading wiring is used to lead out a gate signal from a gate wiring, and a source/drain signal wiring is used to lead out a drain signal, said gate signal leading wiring and said source/drain signal wiring of said second inverter element are located on different circuit layers; and a third inverter element, the inputting end of said third inverter element is connected to the outputting end of said second inverter element, the outputting end of said third for outputting an output signal, wherein a gate signal leading wiring is used to lead out a gate signal from a gate wiring, and a source/drain signal wiring is used to lead out a drain signal, said gate signal leading wiring and said source/drain signal wiring of said third inverter element are located on different circuit layers, herein, the inputting end of said first inverter is linked to the inputting end of said third inverter, and the outputting end of said first inverter is linked to the outputting end of said third inverter for outputting an inverted signal of said input signal received by said first inverter.

11. The fault-tolerant inverter circuit according to claim 10, wherein said gate wiring is located on a circuit layer above the layer of containing said source/drain signal implanting area close to the Vss, below the layer of containing said gate signal leading wiring, and below the second layer of containing said source/drain signal wiring.

12. The fault-tolerant inverter circuit according to claim 10, wherein said gate wiring is located on a circuit layer above the layer of containing said source/drain signal implanting area close to the VDD, below the layer of containing said gate signal leading wiring, and below the second layer of containing said source/drain signal wiring.

13. A fault-tolerant inverter, comprising:

odd series inverter set that each inverter set comprises odd series inverters, wherein said inverter set has an addition path to bypass even series inverters to form a fault-tolerant inverters.

14. The fault-tolerant inverter according to claim 13, wherein a gate signal leading wiring that used to lead out a gate signal, and a source/drain signal wiring that used to lead out a drain signal of said inverter are located on different circuit layers.

15. The fault-tolerant inverter according to claim 13, wherein said inverter has a route for bypassing two inverters.

* * * * *